(12) United States Patent
Jin

(10) Patent No.: US 8,169,254 B2
(45) Date of Patent: May 1, 2012

(54) SEMICONDUCTOR APPARATUS AND METHOD FOR CONTROLLING THE SAME

(75) Inventor: Sin Hyun Jin, Ichon-shi (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 100 days.

(21) Appl. No.: 12/839,303

(22) Filed: Jul. 19, 2010

(65) Prior Publication Data

US 2011/0187443 A1    Aug. 4, 2011

(30) Foreign Application Priority Data

Jan. 29, 2010  (KR) .................. 10-2010-0008673

(51) Int. Cl.
*G05F 1/10* (2006.01)
(52) U.S. Cl. ...................... 327/536; 327/565
(58) Field of Classification Search .......... 327/536, 327/537, 564, 565, 566
See application file for complete search history.

(56) References Cited

U.S. PATENT DOCUMENTS

| | | | |
|---|---|---|---|
| 6,490,220 B1 * | 12/2002 | Merritt et al. ................. | 365/226 |
| 6,924,551 B2 | 8/2005 | Rumer et al. | |
| 7,068,515 B2 * | 6/2006 | Harris et al. ................... | 361/709 |
| 7,863,960 B2 * | 1/2011 | Wang et al. .................... | 327/291 |
| 7,969,239 B2 * | 6/2011 | Van Tran et al. .............. | 327/564 |
| 2009/0051045 A1 | 2/2009 | Mun et al. | |
| 2009/0180257 A1 | 7/2009 | Park et al. | |
| 2009/0243046 A1 | 10/2009 | Shi et al. | |

FOREIGN PATENT DOCUMENTS

KR    1020070080883    8/2007

* cited by examiner

*Primary Examiner* — Jeffrey Zweizig
(74) *Attorney, Agent, or Firm* — William Park & Associates Ltd.

(57) ABSTRACT

A semiconductor apparatus includes a plurality of pump control units respectively located in a plurality of chips, connected in series through a first TSV, and configured to sequentially delay a period signal, transmit delayed period signals and generate pump control signals based on the period signal or the delayed period signals; and a plurality of voltage pump units respectively located in the plurality of chips, and configured to generate a pumping voltage in response to the pump control signals generated from the plurality of pump control units.

17 Claims, 6 Drawing Sheets

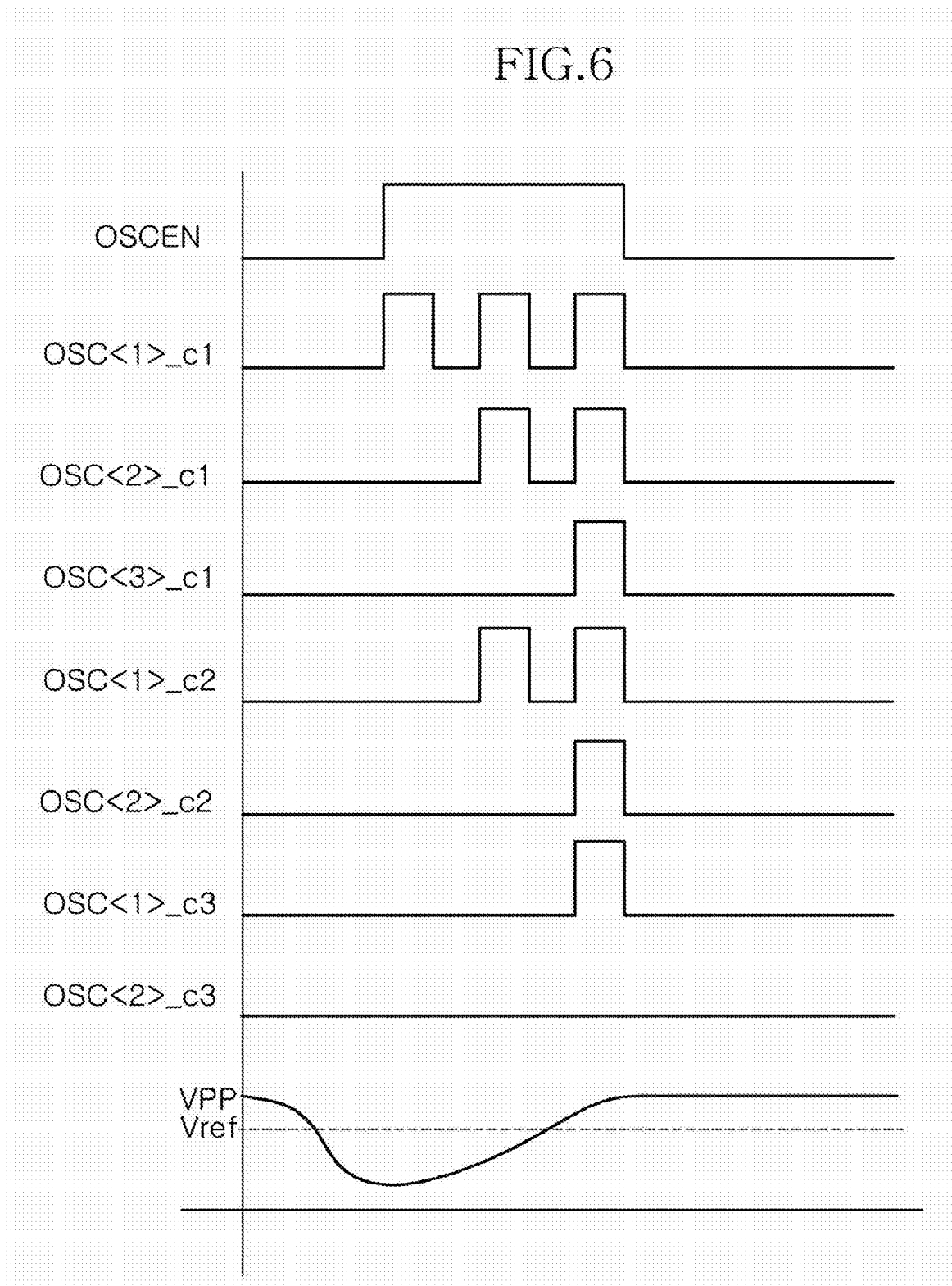

SEMICONDUCTOR APPARATUS AND METHOD FOR CONTROLLING THE SAME

CROSS-REFERENCES TO RELATED APPLICATION

The present application claims priority under 35 U.S.C. §119(a) to Korean Application No. 10-2010-0008673, filed on Jan. 29, 2010, in the Korean Intellectual Property Office, which is incorporated herein by reference in its entirety as if set forth in full.

BACKGROUND

1. Technical Field

The present invention relates to a semiconductor apparatus, and more particularly, to pumping voltage generation in a semiconductor apparatus.

2. Related Art

A semiconductor apparatus typically boosts an external voltage applied as power, generates high voltages, and uses the generated high voltages in internal circuits. The semiconductor apparatus has a voltage pumping circuit for this purpose to generate the high voltages from the external voltage. The high voltages generated by the pumping circuit are referred to as pumping voltages.

FIG. 1 is a diagram schematically illustrating the configuration of a conventional pumping circuit. Referring to FIG. 1, a conventional pumping circuit includes a voltage detection unit 10, an oscillator 20, a split unit 30, and a voltage pump 40. The voltage detection unit 10 compares the levels of a pumping voltage VPP with a reference voltage Vref and generates an enable signal OSCEN. The oscillator 20 generates a period signal OSCPRE when the enable signal OSCEN is enabled. The split unit 30 splits the period signal OSCPRE into a plurality of pump control signals OSC<1:n>. The voltage pump 40 includes a plurality of pumps and performs a pumping operation in response to the plurality of pump control signals OSC<1:n> generated by the split unit 30. When the level of the pumping voltage VPP becomes lower than the level of the to reference voltage Vref in the pumping circuit configured as described above, the level of the pumping voltage VPP is raised through a pumping operation until the pumping voltage VPP reaches a target voltage level.

FIG. 2 schematically illustrates the pumping circuit shown in FIG. 1 which is applied to a multi-chip semiconductor apparatus. Referring to FIG. 2, the multi-chip semiconductor apparatus comprises first to eighth chips c1-c8 which are stacked to constitute the single semiconductor memory apparatus. As illustrated in FIG. 2, each of the first to eighth chips c1-c8 has its own pumping circuit as shown in FIG. 1. If the level of a pumping voltage VPP becomes lower than a target voltage level, each of the first to eighth chips c1-c8 raises the level of its pumping voltage VPP through the pumping circuit contained in its own chip. The pumping voltage VPP is shared by the respective chips through wires or through-silicon vias (TSVs).

FIG. 3 is a timing diagram illustrating operations of the semiconductor apparatus shown in FIG. 2. As illustrated in FIG. 3, if the level of the pumping voltage VPP becomes lower than the level of a reference voltage Vref and an enable signal OSCEN is enabled, the pumps of the first to eighth chips c1-c8 simultaneously operate in response to a plurality of pump control signals OSC<1:n>_c1 through OSC<1:n>_c8. In FIG. 3, as the enable signal OSCEN is enabled, one pump among the pumps constituting voltage pumps 14, 24, ... 84 in the first to eighth chips c1-c8 can simultaneously operate in response to pump control signals OSC<1>_c1 through OSC<1>_c8, and two pumps among the pumps constituting the voltage pumps 14, 24, ... 84 of the first to eighth chips c1-c8 can simultaneously operate in response to pump control signals OSC<1>_c1 through OSC<1>_c8 and OSC<2>_c1 through OSC<2>_c8. In this regard, if the pumps of the first to eighth chips c1-c8 operate simultaneously, the level of the generated pumping voltage VPP may significantly exceed the target voltage level. Also, even though the pumping voltage is shared through the wires, all the chips should be equipped with circuits to detect the level of the pumping voltage VPP.

SUMMARY

In one embodiment of the present invention, a semiconductor apparatus comprises a plurality of pump control units respectively located in a plurality of chips, connected in series through a first TSV, and configured to sequentially delay a period signal, transmit delayed period signals and generate pump control signal based on the period signal or the delayed period signals; and a plurality of voltage pump units respectively located in the plurality of chips, and configured to generate a pumping voltage in response to the pump control signals generated from the plurality of pump control units.

In another embodiment of the present invention, a method for controlling a semiconductor apparatus comprises the steps of transmitting delayed period signals which are obtained by sequentially delaying a period signal by a predetermined time, to a plurality of chips through a TSV; generating pump control signals from the delayed period signals transmitted through the TSV, in the plurality of chips; generating a pumping voltage in response to the pump control signals.

In another embodiment of the present invention, a is semiconductor apparatus having a first and a second chips comprises a first pump control unit located in the first chip, and configured to receive a period signal, generate a delayed period signal by delaying the period signal by a predetermined time and generate a first chip pump control signal based on the period signal; a first voltage pump unit configured to generate a pumping voltage in response to the first chip pump control signal; a second pump control unit located in the second chip, and configured to generate a second chip pump control signal based on the delayed period signal; and a second voltage pump unit configured to generate the pumping voltage in response to the second chip pump control signal.

BRIEF DESCRIPTION OF THE DRAWINGS

Features, aspects, and embodiments are described in conjunction with the attached drawings, in which:

FIG. 6 is a timing diagram illustrating operations of the semiconductor apparatus in accordance with the embodiment of the present invention.

DETAILED DESCRIPTION

Hereinafter, a semiconductor apparatus and a method for controlling the same according to the present invention will be described below with reference to the accompanying drawings through preferred embodiments.

Figure 1:
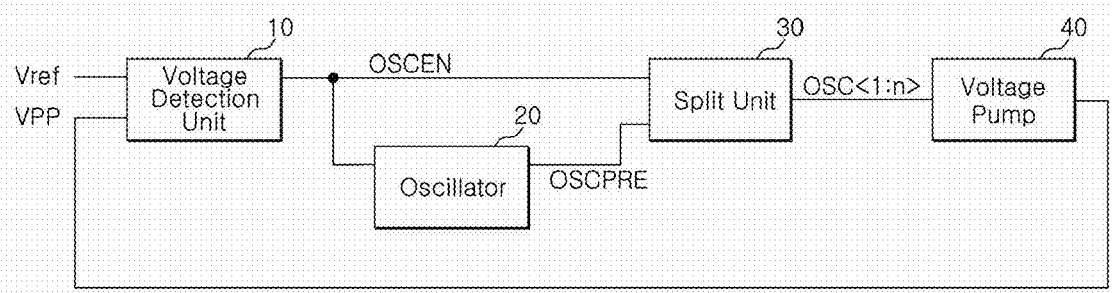
FIG. 1 is a diagram schematically illustrating the configuration of a conventional pumping circuit.
Figure 2:
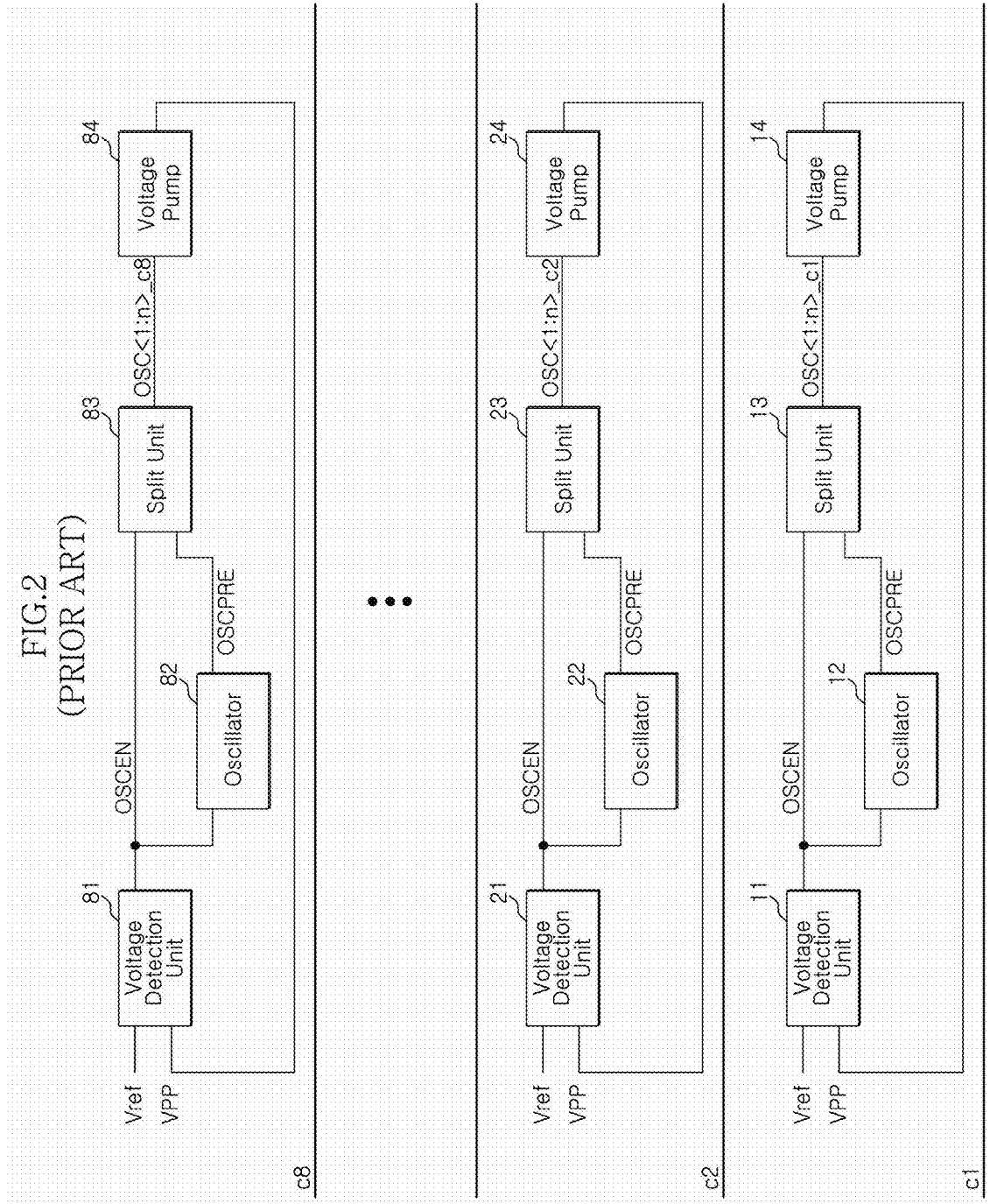
FIG. 2 is a schematic diagram of the pumping circuit shown in FIG. 1 which is applied to a multi-chip semiconductor apparatus.
Figure 3:
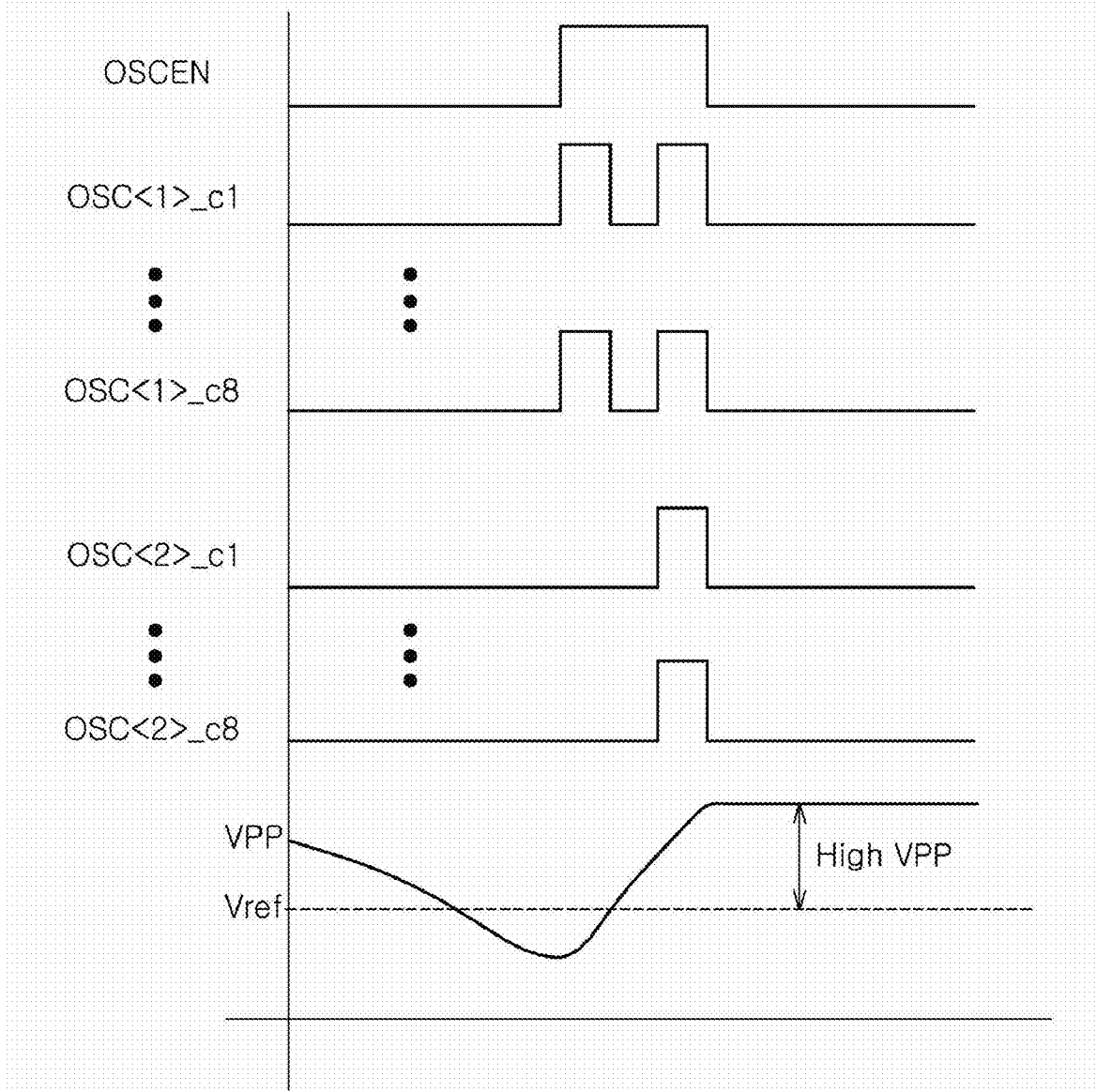
FIG. 3 is a timing diagram illustrating operations of the semiconductor apparatus shown in FIG. 2.
Figure 4:
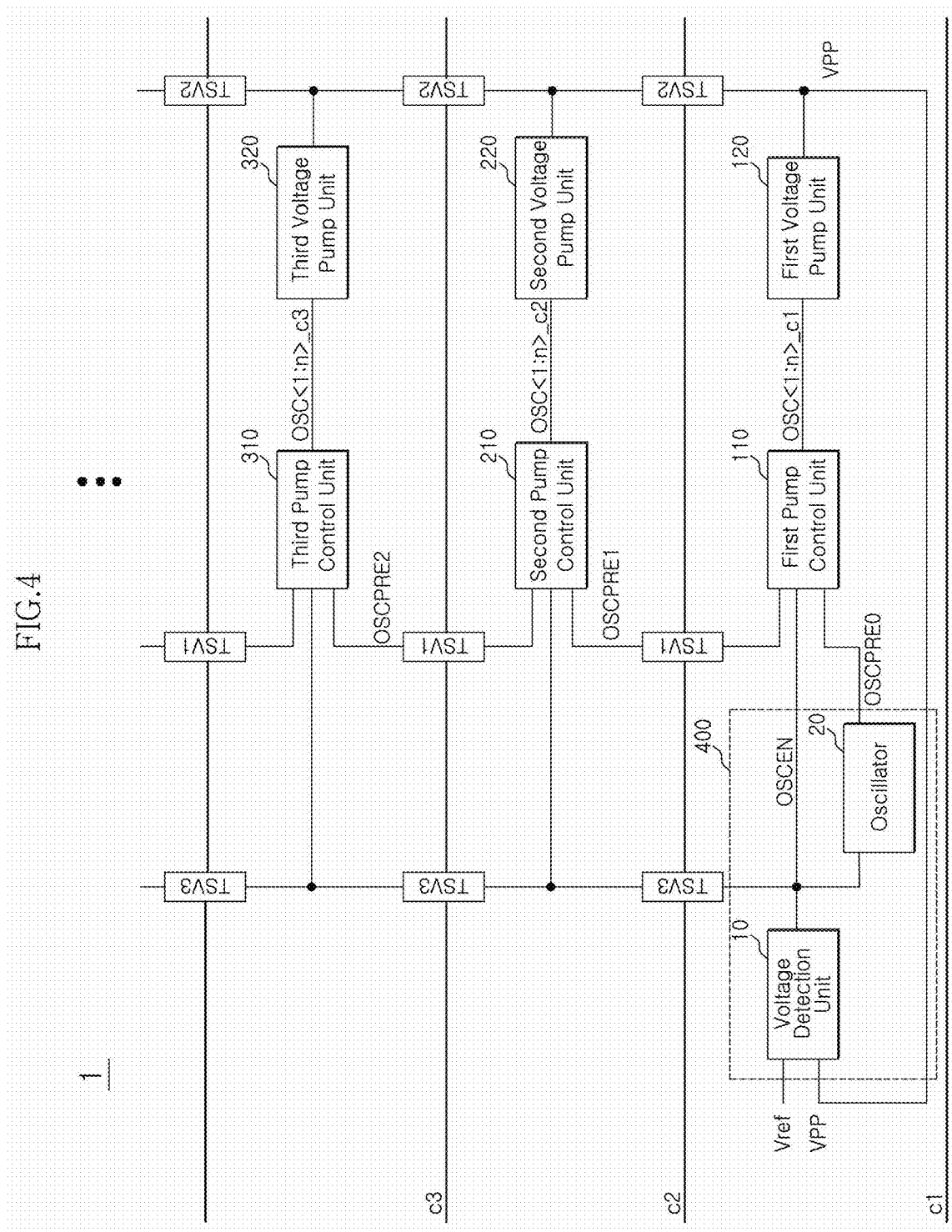
FIG. 4 is a diagram schematically illustrating the configuration of a semiconductor apparatus in accordance with an embodiment of the present invention.

FIG. 4 is a diagram schematically illustrating the configuration of a semiconductor apparatus in accordance with an embodiment of the present invention. Referring to FIG. 4, a plurality of chips are stacked to constitute a single semiconductor apparatus 1. The plurality of chips may be electrically connected with one another through through-silicon vias (TSVs).

While it is illustrated in FIG. 4 that the first to third chips c1 through c3 are stacked to constitute the semiconductor apparatus 1, there is no limit on the number of stacked chips. The first to third chips c1 through c3 may have pump control units 110, 210 and 310 and voltage pump units 120, 220 and 320, respectively. In FIG. 4, the first chip c1 includes the first pump control unit 110 and the first voltage pump unit 120, the second chip c2 includes the second pump control unit 210 and the second voltage pump unit 220, and the third chip c3 includes the third pump control unit 310 and the third voltage pump unit 320.

The first to third pump control units 110, 210 and 310 are connected in series with one another through a first TSV TSV1. The first to third pump control units 110, 210 and 310 sequentially delay a period signal OSCPRE0 by a predetermined time. Therefore, the first pump control unit 110 delays the period signal OSCPRE0, generates a first delayed period signal OSCPRE1, and transmits the first delayed period signal OSCPRE1 to the first TSV TSV1. The second pump control unit 210 delays the first delayed period signal OSCPRE1, generates a second delayed period signal OSCPRE2, and transmits the second delayed period signal OSCPRE2 to the first TSV TSV1. The third pump control unit 310 receives the second delayed period signal OSCPRE2 from the first TSV TSV1.

The first pump control unit 110 generates first chip pump control signals OSC<1:n>_c1 based on the period signal OSCPRE0. The first voltage pump unit 120 performs a pumping operation in response to the first chip pump control signals OSC<1:n>_c1 and generates a pumping voltage VPP. The second pump control unit 210 generates second chip pump control signals OSC<1:n>_c2 based on the first delayed period signal OSCPRE1. The second voltage pump unit 220 performs a pumping operation in response to the second chip pump control signals OSC<1:n>_c2 and generates the pumping voltage VPP. Similarly, the third pump control unit 310 generates third chip pump control signals OSC<1:n>_c3 based on the second delayed period signal OSCPRE2. The third voltage pump unit 320 is performs a pumping operation in response to the third chip pump control signals OSC<1:n>_c3 and generates the pumping voltage VPP. The output terminals of the first to third voltage pump units 120, 220 and 320 are connected through a second TSV TSV2. Accordingly, the first to third chips c1 through c3 may share the pumping voltage VPP through the second TSV TSV2. Also, each of the first to third voltage pump units 120, 220 and 320 may be composed of a plurality of pumps, for example, n number of pumps. The first to third chip pump control signals OSC<1: n>_c1, OSC<1:n>_c2 and OSC<1:n>_c3 generated from the first to third pump control units 110, 210 and 310 may respectively have n number of signals.

Since the period signal OSCPRE0, the first delayed period signal OSCPRE1 and the second delayed period signal OSCPRE2 are transmitted through the first TSV TSV1 and are sequentially delayed by the predetermined time through the first to third pump control units 110, 210 and 310, the first to third chip pump control signals OSC<1:n>_c1, OSC<1: n>_c2 and OSC<1:n>_c3 generated from the first to third pump control units 110, 210 and 310 are not simultaneously enabled. Instead, they may be sequentially enabled with an interval of the predetermined time. Accordingly, the semiconductor apparatus 1 may first activate the first voltage pump unit 120 which is located in the first chip c1, and then, may sequentially activate the second and third voltage pump units 220 and 320.

As shown in FIG. 4, the first chip c1 may further include a control signal generation block 400. The control signal generation block 400 is configured to detect the level of the pumping voltage VPP and generate an enable signal OSCEN and the period signal OSCPRE0. The control signal generation block 400 generates the enable signal OSCEN and the period signal OSCPRE0 when the level of the pumping voltage VPP is lowered below a target voltage level such that the level of the pumping voltage VPP may be raised.

In FIG. 4, the control signal generation block 400 includes a voltage detection unit 10 and an oscillator 20. The voltage detection unit 10 compares the levels of the pumping voltage VPP with a reference voltage Vref and generates the enable signal OSCEN. For example, the voltage detection unit 10 enables the enable signal OSCEN when the level of the pumping voltage VPP is below the level of the reference voltage Vref, and disables the enable signal OSCEN when the level of the pumping voltage VPP is above or equal to the level of the reference voltage Vref. The level of the reference voltage Vref may be optionally determined according to the target level of the pumping voltage VPP. The enable signal OSCEN may be inputted to the first to third pump control units 110, 210 and 310 which are respectively located in the first to third chips c1 through c3, through a third TSV TSV3. Hence, it is sufficient to provide the control signal generation block 400 in the first chip c1, and not necessarily in the second and third chips c2 and c3.

The oscillator 20 generates the period signal OSCPRE0 when the enable signal OSCEN is enabled. The period signal OSCPRE0 is inputted to the first pump control unit 110 which is located in the first chip c1. The voltage detection unit 10 and the oscillator 20 constituting the control signal generation block 400 may be configured in the same way known to the person of ordinary skill.

Figure 5:
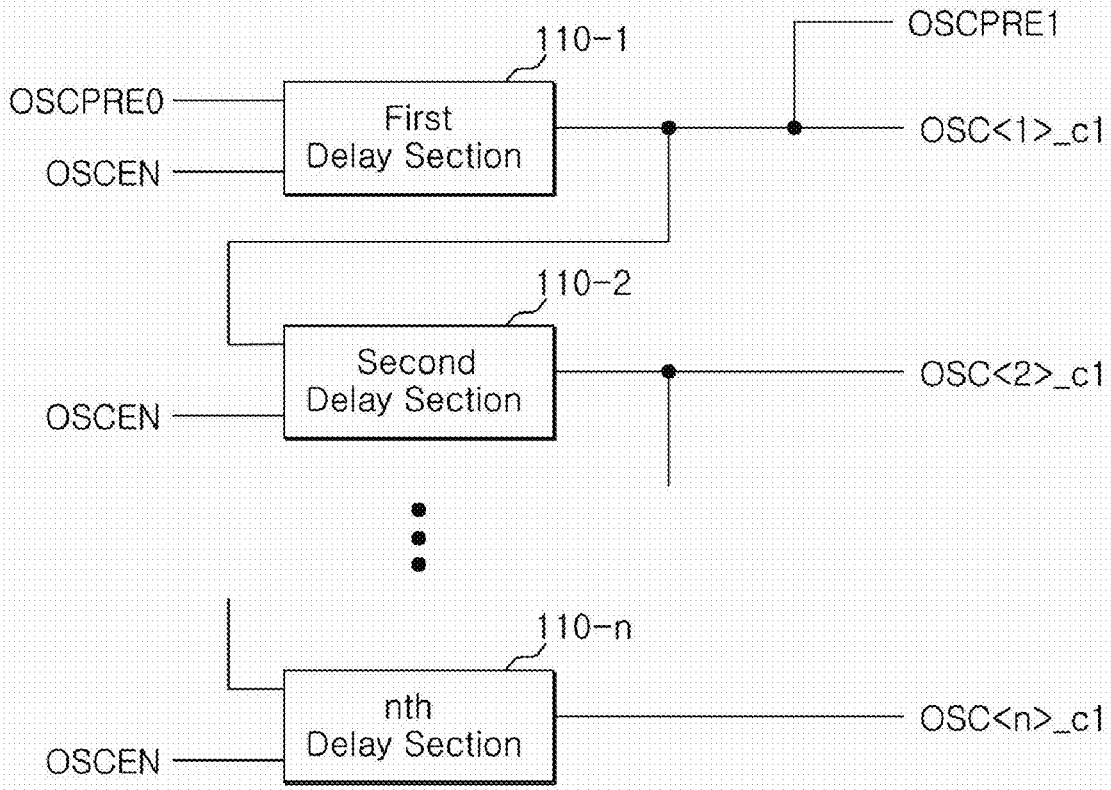
FIG. 5 is a block diagram schematically illustrating the is configuration of a first pump control unit shown in FIG. 4.

FIG. 5 is a block diagram schematically illustrating the configuration of the first pump control unit shown in FIG. 4. The first to third pump control units 110, 210 and 310 have the same configuration. In FIG. 5, the first pump control unit 110 includes first through $n^{th}$ delay sections 110-1 through 110-n, and the number of the delay sections may vary depending upon the number of the chip pump control signals OSC<1: n>_c1. In other words, the number of the delay sections may vary depending upon the number of the pumps constituting the first voltage pump unit 120. The first delay section 110-1 receives the enable signal OSCEN and the period signal OSCPRE0. When the enable signal OSCEN is enabled, the first delay section 110-1 delays the period signal OSCPRE0 by the predetermined time and outputs the resultant signal. The first delay section 110-1 interrupts the output of the signal when the enable signal OSCEN is disabled. The output of the first delay section 110-1 becomes the first chip pump control signal OSC<1>_c1. The output of the first delay section 110-1 is also inputted to the second pump control unit 210 through the first TSV TSV1 as the first delayed period signal OSCPRE1.

The second delay section 110-2 receives the output of the first delay section 110-1, and generates the first chip pump control signal OSC<2>_c1. The third through $n^{th}$ delay sections 110-3 through 110-n respectively receive the outputs of the previous delay sections, and generate the first chip pump control signals OSC<3:n>_c1. The first through $n^{th}$ delay sections have the same configuration and may comprise flip-flops.

Through the above-described configuration, the first pump control unit 110 may generate the first delayed period signal OSCPRE1 which is obtained by delaying the period signal OSCPRE0 by the predetermined time, and may generate the plurality of first chip pump control signals OSC<1:n>_c1 which are outputted by being sequentially delayed by the predetermined time.

Due to the fact that the second and third pump control units 210 and 310 have the same configuration as the first pump control unit 110, the second pump control unit 210 may generate the second delayed period signal OSCPRE2 which is delayed by the predetermined time from the first delayed period signal OSCPRE1 and the plurality of second chip pump control signals OSC<1:n>_c2 which are sequentially outputted with the interval of the predetermined time, and the third pump control unit 310 may generate the plurality of third chip pump control signals OSC<1:n>_c3 which are outputted by being sequentially delayed from the second delayed period signal OSCPRE2 by the interval of the predetermined time.

FIG. 6 is a timing diagram illustrating operations of the semiconductor apparatus 1 in accordance with the embodiment of the is present invention. Operations of the semiconductor apparatus 1 in accordance with the embodiment of the present invention will be described below with reference to FIGS. 4 through 6. If the pumping voltage VPP is lowered below the level of the reference voltage Vref, the voltage detection unit 10 enables the enable signal OSCEN, and the oscillator 20 generates the period signal OSCPRE0. The first pump control unit 110 generates the first delayed period signal OSCPRE1 by delaying the period signal OSCPRE0 by the predetermined time, and generates the first chip pump control signals OSC<1:n>_c1 which are outputted by being sequentially delayed by the predetermined time through the first through $n^{th}$ delay sections 110-1 through 110-n.

The second pump control unit 210 generates the second delayed period signal OSCPER2 in response to the first delayed period signal OSCPRE1, and generates the second chip pump control signals OSC<1:n>_c2 which are outputted by being sequentially delayed by the predetermined time. Similarly, the third pump control unit 310 receives the second delayed period signal OSCPER2, and generates the third chip pump control signals OSC<1:n>_c3 which are outputted by being sequentially delayed by the predetermined time.

The first to third voltage pump units 120, 220 and 320 perform pumping operations in response to the first to third chip pump control signals OSC1<1:n>_c1, OSC<1:n>_c2 and OSC<1:n>_c3, and raise the level of the pumping voltage VPP. If the pumping voltage VPP becomes equal to or higher than the level of the reference voltage Vref, the voltage detection unit 10 disables the enable signal OSCEN, and the first to third pump control units 110, 210 and 310 disable all the chip pump control signals OSC1<1:n>_c1, OSC<1:n>_c2 and OSC<1:n>_c3.

Referring to FIG. 6, it may be seen that, while the pumping voltage VPP is lower than the level of the reference voltage Vref and the enable signal OSCEN is in the enabled state, the first chip pump control signals OSC<1:3>_c1 are generated and three pumps among the n numbered pumps constituting the first voltage pump unit 120 are operated, the second chip pump control signals OSC<1:2>_c2 are generated and two pumps among the n numbered pumps constituting the second voltage pump unit 220 are operated, and the third chip pump control signal OSC<1>_c3 is generated and one pump among the n numbered pumps constituting the third voltage pump unit 320 is operated. That is to say, one pump among the n numbered pumps constituting the first voltage pump unit 120 performs the pumping operation as the enable signal OSCEN is enabled, two pumps of the first voltage pump unit 120 and one pump of the second voltage pump unit 220 perform the pumping operations after the predetermined time is lapsed, and three pumps of the first voltage pump unit 120, two pumps of the second voltage pump unit 220 and one pump of the third voltage pump unit 320 perform the pumping operations after the predetermined time is lapsed again.

Thereafter, as the enable signal OSCEN is disabled, all the chip pump control signals OSC1<1:n>_c1, OSC<1:n>_c2 and OSC<1:n>_c3 are disabled. Accordingly, it can be appreciated that all the pumps do not perform the pumping operations to raise the level of the pumping voltage VPP and only a certain number of pumps sufficient for raising the level of the pumping voltage VPP perform the pumping operations.

In the conventional art, if the level of the pumping voltage VPP is lowered below the target voltage level, all the pump control signals are simultaneously enabled and all the pumps perform the pumping operations. However, in the semiconductor apparatus 1 in accordance with the embodiment of the present invention, since only an appropriate number of pumps are operated to raise the level of the pumping voltage VPP, excessive raise in the level of the pumping voltage is prevented, and current consumption may be reduced.

Further, since a circuit configuration for generating the pumping voltage may be simplified using the TSVs, the layout areas may be secured in the chips which constitute the semiconductor apparatus.

While certain embodiments have been described above, it will be understood to those skilled in the art that the embodiments described are by way of example only. Accordingly, the semiconductor apparatus and the method described herein should not be limited based on the described embodiments. Rather, the semiconductor apparatus and the method described herein should only be limited in light of the claims that follow when taken in conjunction with the above description and accompanying drawings.

What is claimed is:

1. A semiconductor apparatus comprising:
   a plurality of pump control units respectively located in a plurality of chips, connected in series through a first TSV, and configured to sequentially delay a period signal, transmit delayed period signals and generate pump control signal based on the period signal or the delayed period signals; and
   a plurality of voltage pump units respectively located in the plurality of chips, and configured to generate a pumping voltage in response to the pump control signals generated from the plurality of pump control units.

2. The semiconductor apparatus according to claim 1, further comprising:
   a control signal generation block configured to detect a level of the pumping voltage and generate the period signal and an enable signal.

3. The semiconductor apparatus according to claim 2, wherein the enable signal is inputted to the plurality of pump control units through a second TSV.

4. The semiconductor apparatus according to claim 2, wherein the control signal generation block is provided in one chip of the plurality of chips.

5. The semiconductor apparatus according to claim 3, wherein each of the plurality of pump control units is configured to generate the pump control signals when the enable signal is enabled.

6. The semiconductor apparatus according to claim 1, wherein the pumping voltage is shared by the plurality of chips through a third TSV.

7. A method for controlling a semiconductor apparatus, comprising the steps of:
   transmitting delayed period signals which are obtained by sequentially delaying a period signal by a predetermined time, to a plurality of chips through a TSV;
   generating pump control signals from the delayed period signals transmitted through the TSV, in the plurality of chips; and
   generating a pumping voltage in response to the pump control signals.

8. The method according to claim 7, wherein, before transmitting the delayed period signals to the plurality of chips, the method further comprises:
   transmitting an enable signal through another TSV to the plurality of chips.

9. The method according to claim 8, wherein generating the pump control signals comprises:
   generating the pump control signals based on the period signal or the delayed period signals when the enable signal is enabled.

10. The method according to claim 8, further comprising:
    detecting a level of the pumping voltage and enabling the enable signal depending upon a detection result.

11. A semiconductor apparatus having a first and a second chips comprising:
    a first pump control unit located in the first chip, and configured to receive a period signal, generate a delayed period signal by is delaying the period signal by a predetermined time and generate a first chip pump control signal based on the period signal;
    a first voltage pump unit configured to generate a pumping voltage in response to the first chip pump control signal;
    a second pump control unit located in the second chip, and configured to generate a second chip pump control signal based on the delayed period signal; and
    a second voltage pump unit configured to generate the pumping voltage in response to the second chip pump control signal.

12. The semiconductor apparatus according to claim 11, wherein the delayed period signal is transmitted to the second pump control unit through a first TSV.

13. The semiconductor apparatus according to claim 11, further comprising:
    a control signal generation block configured to detect a level of the pumping voltage and generate an enable signal and the period signal.

14. The semiconductor apparatus according to claim 13, wherein the control signal generation block is located in the first chip.

15. The semiconductor apparatus according to claim 13, wherein the enable signal is transmitted to the first and second pump control units through a second TSV.

16. The semiconductor apparatus according to claim 15, wherein the first and second pump control units are configured to generate the first and second chip pump control signals when the enable signal is enabled.

17. The semiconductor apparatus according to claim 11, wherein the pumping voltage is shared by the first and second chips through a third TSV.

* * * * *